(12) United States Patent
Takagi et al.

(10) Patent No.: US 11,041,240 B2
(45) Date of Patent: Jun. 22, 2021

(54) SUBSTRATE PROCESSING APPARATUS, METHOD OF MANUFACTURING SEMICONDUCTOR DEVICE, AND RECORDING MEDIUM

(71) Applicant: HITACHI KOKUSAI ELECTRIC INC., Tokyo (JP)

(72) Inventors: Kosuke Takagi, Toyama (JP); Risa Yamakoshi, Toyama (JP); Hideki Horita, Toyama (JP); Atsushi Hirano, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 56 days.

(21) Appl. No.: 15/928,817

(22) Filed: Mar. 22, 2018

(65) Prior Publication Data

US 2018/0274098 A1    Sep. 27, 2018

(30) Foreign Application Priority Data

Mar. 27, 2017   (JP) .............................. JP2017-060939

(51) Int. Cl.
  *H01L 21/02*   (2006.01)
  *C23C 16/455*  (2006.01)
  (Continued)

(52) U.S. Cl.
  CPC ...... *C23C 16/45563* (2013.01); *C23C 16/401* (2013.01); *C23C 16/4412* (2013.01);
  (Continued)

(58) Field of Classification Search
  CPC ........ C23C 16/45563; C23C 16/45502; C23C 16/45546; C23C 16/45578; C23C 16/52;
  (Continued)

(56) References Cited

U.S. PATENT DOCUMENTS

| 8,741,063 B2* | 6/2014 | Yamazaki ......... C23C 16/45527 |
|  |  | 118/715 |
| 2005/0098107 A1 | 5/2005 | Du Bois et al. |

(Continued)

FOREIGN PATENT DOCUMENTS

| CN | 102034702 A | 4/2011 |
| JP | 2001-110728 A | 4/2001 |

(Continued)

OTHER PUBLICATIONS

Korean Office Action dated Sep. 4, 2019 for the Korean Patent Application No. 10-2018-0030445.

(Continued)

*Primary Examiner* — Rudy Zervigon
(74) *Attorney, Agent, or Firm* — Volpe Koenig

(57) ABSTRACT

There is provided a technique that includes: a process chamber in which a process of forming a film containing a main element on a substrate is performed; a first nozzle configured to supply a precursor containing the main element to the substrate in the process chart; a second nozzle separated from the first nozzle and configured to supply the precursor to the substrate in the process chamber; a third nozzle configured to supply a reactant to the substrate in the process chamber; and a plurality of first exhaust ports configured to exhaust an internal atmosphere of the process chamber, wherein each of the plurality of first exhaust ports is disposed at a position which does not face a first gas ejection hole of the first nozzle and a second gas ejection hole of the second nozzle, in a plan view.

14 Claims, 11 Drawing Sheets

(51) Int. Cl.
*C23C 16/52* (2006.01)
*C23C 16/40* (2006.01)
*C23C 16/44* (2006.01)

(52) U.S. Cl.
CPC .. *C23C 16/45502* (2013.01); *C23C 16/45546* (2013.01); *C23C 16/45578* (2013.01); *C23C 16/52* (2013.01); *H01L 21/0228* (2013.01); *H01L 21/02164* (2013.01); *H01L 21/02211* (2013.01); *H01L 21/02271* (2013.01)

(58) Field of Classification Search
CPC .............. C23C 16/401; C23C 16/4412; C23C 16/45574; H01L 21/0228; H01L 21/02211; H01L 21/02164; H01L 21/02271
USPC ......... 118/715, 696, 704; 156/345.1, 345.31, 156/345.32, 345.33
See application file for complete search history.

(56) References Cited

U.S. PATENT DOCUMENTS

| 2007/0137794 | A1* | 6/2007 | Qiu | .................. C23C 16/45504 156/345.33 |
| 2011/0076857 | A1 | 3/2011 | Akae et al. | |
| 2012/0122318 | A1* | 5/2012 | Sakai | ................... C23C 16/405 438/758 |
| 2014/0357058 | A1 | 12/2014 | Takagi et al. | |
| 2015/0275368 | A1 | 10/2015 | Motoyama et al. | |

FOREIGN PATENT DOCUMENTS

| JP | 2007-243201 | A | 9/2007 |
| JP | 2009-004642 | A | 1/2009 |
| JP | 2014-236129 | A | 12/2014 |
| JP | 2015-185837 | A | 10/2015 |
| KR | 10-1189495 | B1 | 10/2012 |
| TW | 200741877 | A | 11/2007 |

OTHER PUBLICATIONS

Chinese Office Action dated Nov. 14, 2019 for the Chinese Patent Application No. 201810170974.2.
Japanese Office Action dated Jan. 7, 2020 for the Japanese Patent Application No. 2017-060939.
Korean Office Action dated Mar. 20, 2020 for the Korean Patent Application No. 10-2019-0030445.
Chinese Office Action dated May 22, 2020 for Chinese Patent Application No. 201810170974.2.

* cited by examiner

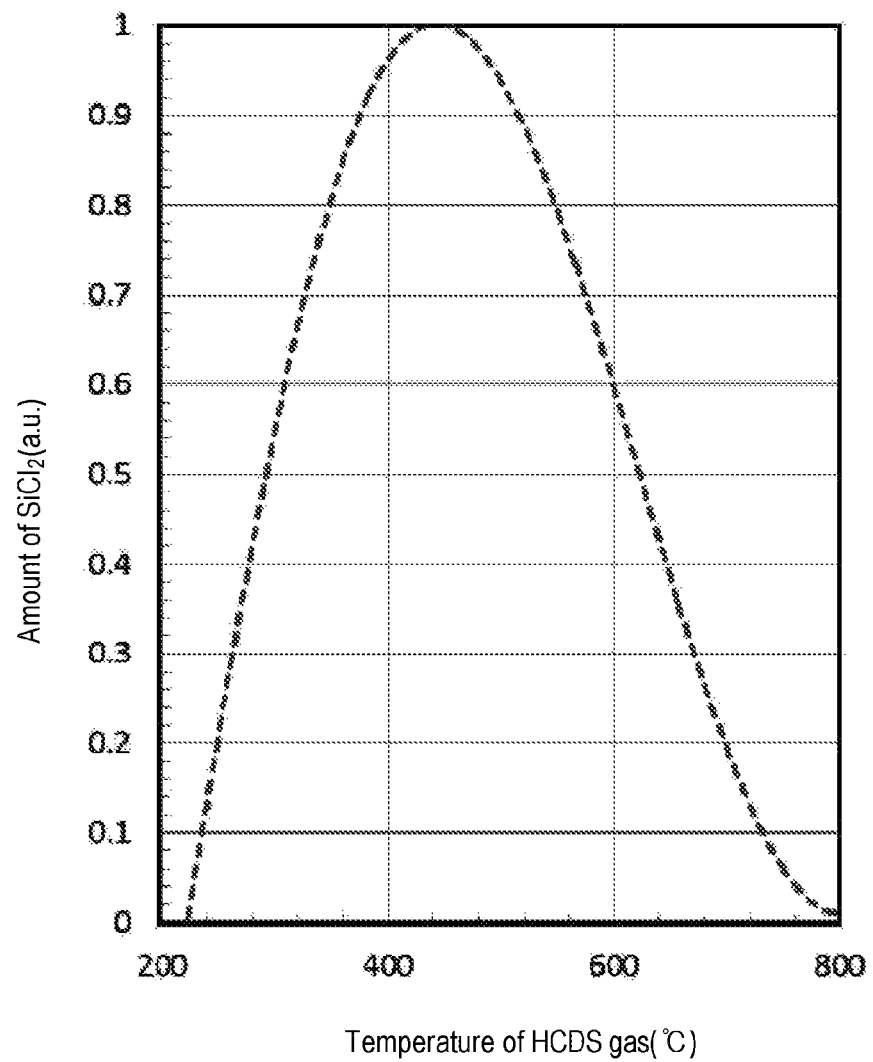

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2017-060919, filed on Mar. 27, 2017, the entire contents of which are incorporated herein by reference.

TECHNICAL FIELD

The present disclosure relates to a substrate processing apparatus for processing a substrate, a method of manufacturing a semiconductor device, and a recording medium.

BACKGROUND

In the related art, as one process of manufacturing a semiconductor device, a process of forming a film on a substrate is often carried out by supplying a precursor and a reactant to the substrate.

SUMMARY

Some embodiments of the present disclosure provide a technique capable of controlling an in-plane film thickness distribution of a film formed on a substrate.

According to one embodiment of the present disclosure, there is provided a technique that includes; a process chamber in which a process of forming a film containing a main element on a substrate is performed; a first nozzle configured to supply a precursor containing the main element to the substrate in the process chamber; a second nozzle installed at a position distant from the first nozzle and configured to supply the precursor to the substrate in the process chamber; a third nozzle configured to supply a reactant to the substrate in the process chamber; and a plurality of exhaust ports configured to exhaust an internal atmosphere of the process chamber, wherein each of the plurality of exhaust ports is disposed at a position which does not face a first gas ejection hole of the first nozzle and a second gas ejection hole of the second nozzle, in a plan view.

BRIEF DESCRIPTION OF DRAWINGS

FIG. 9A is a view showing the temperature of an HCDS gas supplied into the process chamber and FIG. 9B is a view showing thermal decomposition characteristics of the HCDS gas.

DETAILED DESCRIPTION

Embodiments of the Present Disclosure

One embodiment of the present disclosure will now be described with reference to FIGS. 1 to 4.

(1) Configuration of Substrate Processing Apparatus

Figure 1:
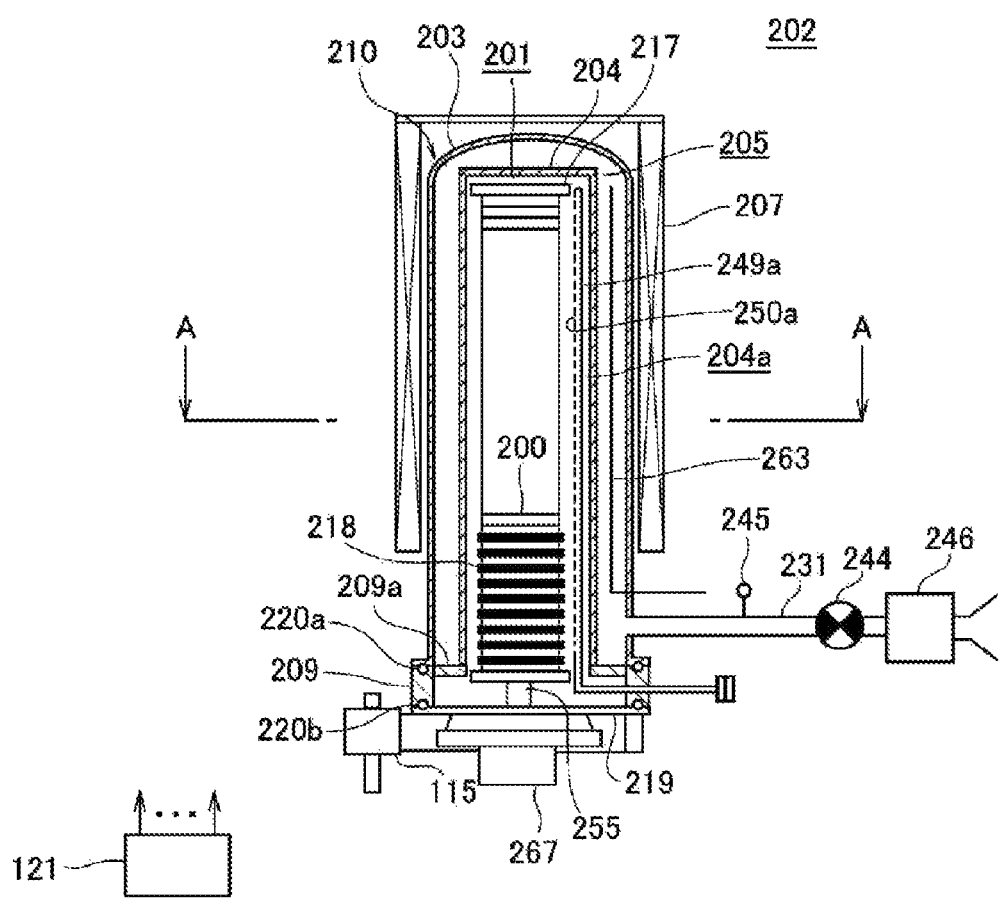
FIG. 1 is a schematic configuration view of a vertical processing furnace of a substrate processing apparatus used in one embodiment of the present disclosure, in which a portion of the processing furnace is shown in a vertical cross section.

As shown in FIG. 1, a processing furnace 202 includes a heater 207 as a heating mechanism (a temperature adjustment pan). The heater 207 has a cylindrical shape and is supported by a support plate so as to be vertically installed. The heater 207 functions as an activation mechanism (an excitation part) configured to thermally activate (excite) a gas.

A reaction tube 210 is disposed inside the heater 207 in a concentric relationship with the heater 207. The reaction tub 210 has a double tube structure including an inner reaction tube (inner tube) 204 and an outer reaction tube (outer tube) 203 concentrically surrounding the inner tube 204. Each of the inner tube 204 and the outer tube 203 is made of a heat resistant material such as quartz ($SiO_2$) or silicon carbide and is formed in a cylindrical shape with its upper end closed and its lower end opened. A process chamber 201 is farmed in the hollow cylindrical portion of the inner tube 204. The process chamber 201 is configured to be able to accommodate a wafer 200 as a substrate.

The inner tube 204 and the outer tube 203 are supported from below by a manifold 209. The manifold 209 is made of a metal material such as stainless steel (SUS) and is formed in a cylindrical shape with its upper end and lower end opened. An annular flange portion 209a, winch is made of a metal material such as SUS and extends radially inward of the manifold 209, is installed on the upper end portion of the inner wall of the manifold 209. The lower end of the inner tube 204 is in contact with the upper surface of the flange portion 209a. The lower end of the outer tube 203 is in contact With the upper end of the manifold 209. An O-ring 220a as a seal member is installed between the outer tube 203 and the manifold 209. The lower end opening of the manifold 209 is configured as a furnace port of the processing furnace 202 and is hermetically sealed by a disk-shaped seal cap 219 as a lid body when a boat 217 is lifted by a boat elevator 115 which will be described later. An O-ring 220b as a seal member is installed between the manifold 209 and the seal cap 219.

The ceiling portion of the inner tube 204 is formed in a flat shape and the ceiling portion of the outer tube 203 is formed in a dome shape. When the ceiling portion of the inner tube 204 has the dome shape, a gas supplied into the process chamber 201 is likely to flow into the internal space of the dome portion in the ceiling portion of the inner tube 204 without flowing among a plurality of wafers 200. When the ceiling portion of the inner tube 204 has the flat shape, it is possible to efficiently allow the gas supplied into the process chamber 201 flow among the plurality of wafers 200. By decreasing a clearance (space) between the ceiling portion of the inner tube 204 and a ceiling plate of the boat 217 to be described later, for example, by decreasing the clearance to be approximately the same as an arrangement interval (pitch) of the wafers 200, it is possible to efficiently allow a gas to flow between the wafers 200.

Figure 2:
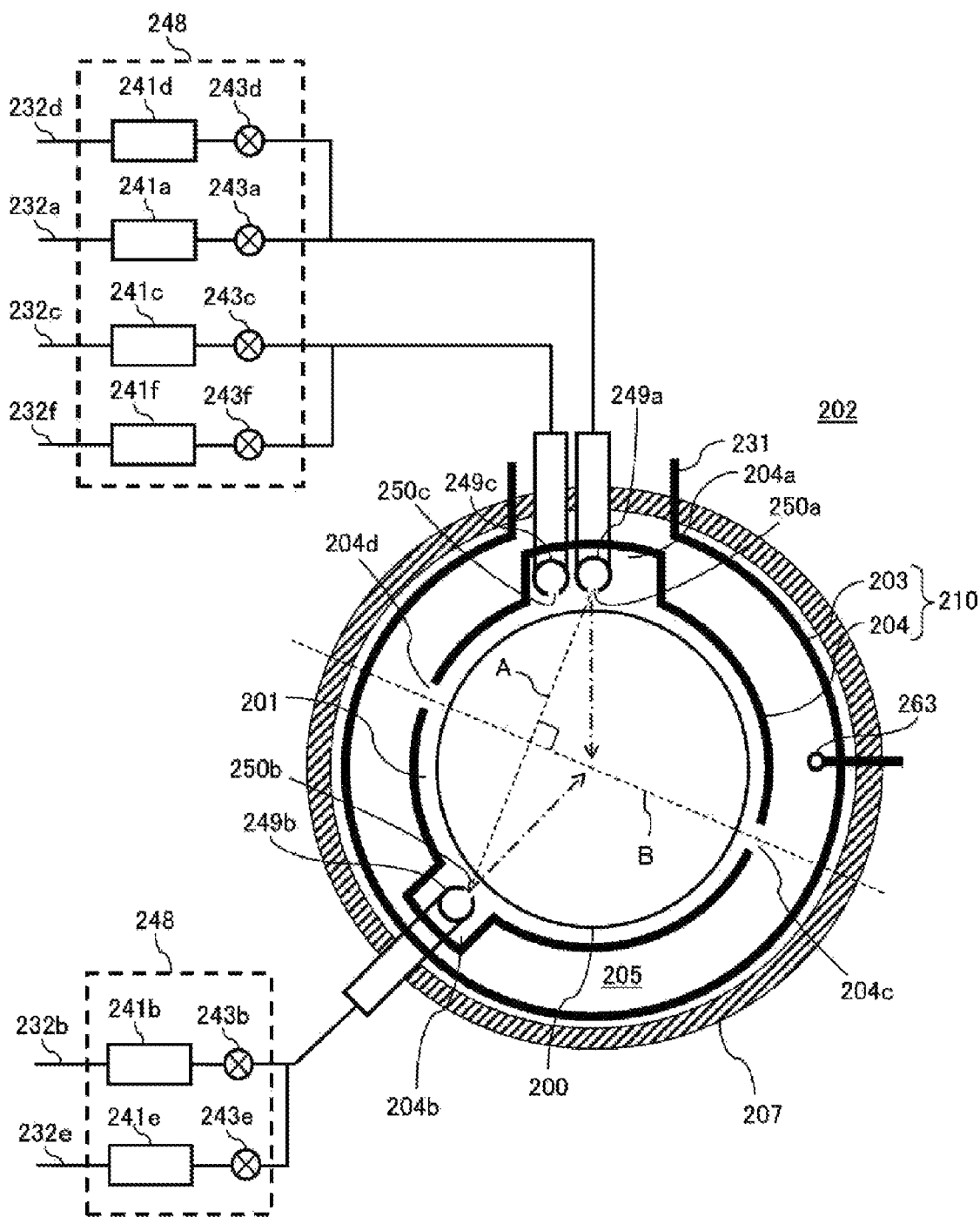
FIG. 2 is a schematic configuration view of the vertical processing furnace of the substrate processing apparatus used in one embodiment of the present disclosure, in which a portion of the processing furnace is shown in a cross section taken along line A-A in FIG. 1.

As shown in FIG. 2, nozzle accommodating chambers 204a, in which a nozzle 249a as a first nozzle and a nozzle 249c as a third nozzle are accommodated, and 204b, in which a nozzle 249b as a second nozzle is accommodated, are formed on the side wall of the inner tube 204. Each of the nozzle accommodating chambers 204a and 204b is formed in a channel shape projecting radially outward of the inner tube 204 from the side wall of the inner tube 204 and extending in the vertical direction. The inner walls of the nozzle accommodating chambers 204a and 204b form a portion of the inner wall of the process chamber 201. The nozzle accommodating chamber 204a and the nozzle accommodating chamber 204b are arranged along the inner wall of the inner tube 204, that is, along the outer periphery of the wafer 200 accommodated in the process chamber 201, at positions separated from each other by a predetermined distance. Specifically, the nozzle accommodating chambers 204a and 204b are arranged at positions where a central angle (i.e., a central angle with respect to an arc with both ends corresponding to the centers of the nozzle accommodating chambers 204a and 204b) formed by a straight line connecting a center of the wafer 200 and a center of the nozzle accommodating chamber 204a and a straight line connecting the center of the wafer 200 and a center of the nozzle accommodating chamber 204b is an angle within a range of, for example, 30 to 150 degrees. The nozzle 249a accommodated in the nozzle accommodating chamber 204a and the nozzle 249b accommodated in the nozzle accommodating chamber 204b are disposed at positions separated from each other by a predetermined distance. The nozzles 249a and 249c accommodated in the nozzle accommodating chamber 204a are disposed in close proximity to each other.

Figure 7A:
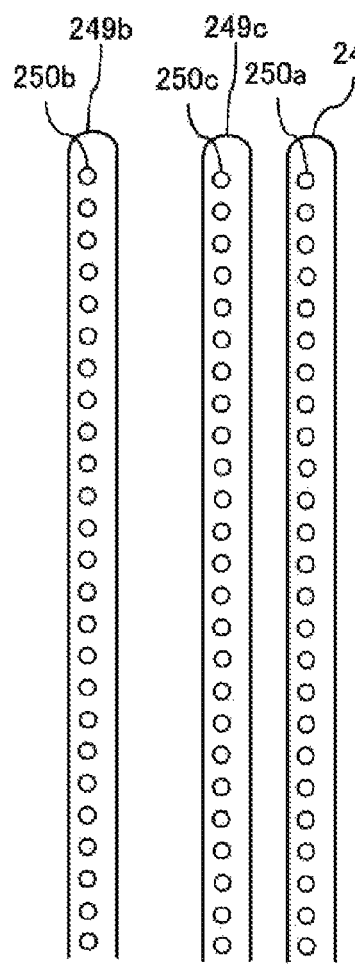
FIG. 7A is a view showing an example of the configuration of first to third nozzles used in one embodiment of the present disclosure and FIGS. 7B to 7E are views showing a modification of the first and second nozzles.

The nozzles 249a to 249c are installed so as to rise upward in a stacking direction of the wafers 200 from lower portions to upper portions of the nozzle accommodating chambers 204a and 204b. In other words, the nozzles 249a to 249c are installed alone a wafer arrangement region where the wafers 200 are arranged, in a region horizontally surrounding the wafer arrangement region on the side of the wafer arrangement region. As shown in FIG. 7A, gas ejection holes 250a to 250c as first to third gas ejection holes are formed on the side surfaces of the nozzles 249a to 249c, respectively. The number of gas ejection holes 250a to 250c is equal to at least the number of wafers 200 so as to correspond to the plurality of wafers 200 accommodated in the process chamber 201 one by one. The gas ejection holes 250a to 250c are formed over the entire region spanning from the lower portions of the nozzles 249a to 249c from the upper portions thereof. When the boat 217 holds, for example, 120 wafers 200, at least 120 gas ejection holes 250a to 250c are formed on a side surface of each vertical portion of the nozzles 249a to 249c. As shown in FIG. 1, it is also possible to form the gas ejection holes 250a to 250c not only in the wafer arrangement region but also below the wafer arrangement region. For example, the gas ejection holes 250a to 250c are opened so as to face a center of the process chamber 201 so that a gas can be supplied toward the center of the wafer 200. Further, for example, the gas ejection holes 250a to 250c have the same opening area and are formed at the same opening pitch. With this configuration, it is possible to prompt the supply of gas to the vicinity of the center of each wafer 200 and it is possible to improve the wafer in-plane uniformity of a film forming process to be described later. Further, it is easy to equalize a flow rate and a flow velocity of a gas supplied to the wafers 200 among the wafers 200, thereby improving a wafer-to-wafer uniformity of the film forming process to be described later.

As shown in FIG. 2, gas supply pipes 232a to 232c are connected to the nozzles 249a to 249c, respectively. Mass flow controllers (MFCs) 241a to 241c, which are flow rate controllers (flow rate control parts), and valves 243a to 243c, which are opening/closing valves, are installed respectively in the gas supply pipes 232a to 232c in order from a gas flow upstream side. Gas supply pipes 232d to 232f for supplying an inert gas are connected to the downstream side of the valves 243a to 243e of the gas supply pipes 232a to 232c, respectively. MFCs 241d to 241f and valves 243d to 243f are installed in the gas supply pipes 232d to 232f in order from the gas flow upstream side.

A precursor (precursor gas), for example, a halosilane precursor gas containing silicon (Si) as a main element and a halogen element, which constitute a film to be formed, is supplied from the gas supply pipes 232a and 232b into the process chamber 201 via the MFCs 241a and 241b, the valves 243a and 243b and the nozzles 249a and 249b, respectively.

The precursor gas is a gaseous gas, for example, a gas obtained by vaporizing a precursor in a liquid state under normal temperature and normal pressure, or a precursor in a gaseous state under normal temperature and normal pressure. The halosilane precursor is a silane precursor containing a halogen group including a halogen element such as chlorine (Cl), fluorine (F), bromine (Br) and iodine (I). As the halosilane source gas, it may be possible to use, e.g., a precursor gas containing Si and Cl, that is, a chlorosilane precursor gas. The chlorosilane precursor gas acts as an Si source. As the chlorosilane precursor gas, it may be possible to use, a hexachlorodisilane ($Si_2Cl_6$, abbreviation: HCDS) gas.

A first reactant (first reaction gas), for example, an oxygen (O)-containing gas, is supplied from the gas supply pipe 232c into the process chamber 201 via the MFC 241c, the valve 243c and the nozzle 249c. The O-containing gas acts as an oxidizing source (oxidizing agent or oxidizing gas), that is, an O source. As the O-containing gas, it may be possible to use, e.g., an oxygen ($O_2$) gas.

A second reactant (second reaction gas), for example, a hydrogen (H)-containing gas, is supplied from the gas supply pipe 232a into the process chamber 201 via the MFC 241a, the valve 243a and the nozzle 249a. The H-containing gas cannot obtain an oxidizing effect by itself. However, the H-containing gas acts to improve an efficiency of oxidation in the film forming process to be described later, by reacting with the O-containing gas under specific conditions to generate an oxidizing species such as atomic oxygen (O). As the H-containing gas, it may be possible to use, e.g., a hydrogen ($H_2$) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c and the nozzles 249a to 249c respectively. The $N_2$ gas acts as a purge gas or a carrier gas.

A first supply system (precursor supply system) mainly includes the gas supply pipes 232a and 232b, the MFCs 241a and 241b and the valves 243a and 243b. A second supply system (reactant supply system) mainly includes the gas supply pipes 232a and 232c, the MFCs 241a and 241c and the valves 243a and 243c. An inert gas supply system includes the gas supply pipes 232d to 232f, the MFCs 241d to 241f and the valves 243d to 243f.

Either or all of the above-described various supply systems may be configured as an integrated supply system 248 in which the valves 243a to 243f, the MFCs 241a to 241f and the like are integrated. The integrated supply system 248 is connected to each of the gas supply pipes 232a to 232f and is configured such that the operations of supplying various gases into the gas supply pipes 232a to 232f, such as the opening and closing operation of the valves 243a to 243f and a flow rate regulating operation by the MFCs 241a to 241f, and the like, are controlled by a controller 121 which will be described later. The integrated supply system 248 is configured as an integral type or division type integrated unit and can be attached to and detached from the gas supply pipes 232a to 232f or the like on an integrated unit basis. Further, the maintenance, replacement, extension and the like of the integrated supply system 248 can be performed on an integrated unit basis.

On the side surface of the inner tube 204 are formed exhaust ports (exhaust slits) 204c and 204d configured as slit-like through holes so as to be elongated in the vertical direction. The exhaust ports 204c and 204d are, for example, rectangular in front view and are respectively formed from the lower portion to the upper portion of the side wall of the inner tube 204. The interior of the process chamber 201 and an exhaust space 205, which is an annular space between the inner tube 204 and the outer tube 203, communicate with each other through the exhaust ports 204c and 204d. Each of the exhaust ports 204c and 204d is disposed at a position not opposed to the gas ejection holes 250a and 250b, with the center of the wafer 200 accommodated in the process chamber 201 interposed therebetween, in a plan view. Specifically assuming that a line segment connecting the gas ejection holes 250a and 250b is a line segment A, the exhaust ports 204c and 204d are respectively disposed on a straight line B, which is a perpendicular bisector of the line segment A, in a plan view. The straight line B passes through the center of the wafer 200. The line segment A connecting the gas ejection holes 250a and 250b and the straight line B passing through the exhaust ports 204c and 204d are orthogonal to each other, and the gas ejection holes 250a and 250b are disposed in line symmetry with respect to the straight line B.

As shown in FIG. 1, an exhaust pipe 231 for exhausting an internal atmosphere of the process chamber 201 via the exhaust space 205 is connected to the lower portion of the outer tube 203. For example, a vacuum pump 246 as a vacuum exhaust device is connected to the exhaust pipe 231 via a pressure sensor 245, which is a pressure detector (pressure detecting part) for detecting an internal pressure of the exhaust space 205, that is, the process chamber 201 and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve based on pressure information detected b the pressure sensor 245 while the vacuum pump 246 is actuated. An exhaust system is mainly constituted by the exhaust pipe 231, the APC valve 244 and the pressure sensor 245. The exhaust ports 204c and 204d, the exhaust space 205 and the vacuum pump 246 may be included in the exhaust system.

The lower end opening of the manifold 209 is hermetically sealed by a seal cap 219 via the O-ring 220b. The seal cap 219 is made of metal material such as, e.g., SUS or the like, and is formed in a disc shape. A rotation mechanism 267 configured to rotate the boat 217 is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating instrument vertically installed outside a reaction tube 210. The boat elevator 215 is configured as a transfer device (transfer mechanism) which loads and unloads (transfers) the wafers 200 supported by the boat 217 into and from the process chamber 201 by moving the seal cap 219 up and down.

The boat 217 serving as a substrate support is configured to support a plurality of wafers 200, e.g., 25 to 200 wafers, in such a state that the wafers 200 are supported in a horizontal posture and in multiple stages along a vertical direction with the renters of the wafers 200 aligned with one another. That is, the wafers 200 are arranged in a spaced-apart relationship. The boat 217 is made of a heat resistant material such as quartz or SiC. Heat insulating plates 218 made of the heat resistant material such as quartz or SiC are installed below the boat 217 in multiple stages.

A temperature sensor 263 serving as a temperature detector is installed between the outer tube 203 and the inner tube 204. Based on temperature information detected by the temperature sensor 263, a state of supplying electric power to the heater 207 is adjusted such that the interior of the process chamber 201 has a desired temperature distribution. The temperature sensor 263 is installed along the inner wall of the outer tube 203.

Figure 3:
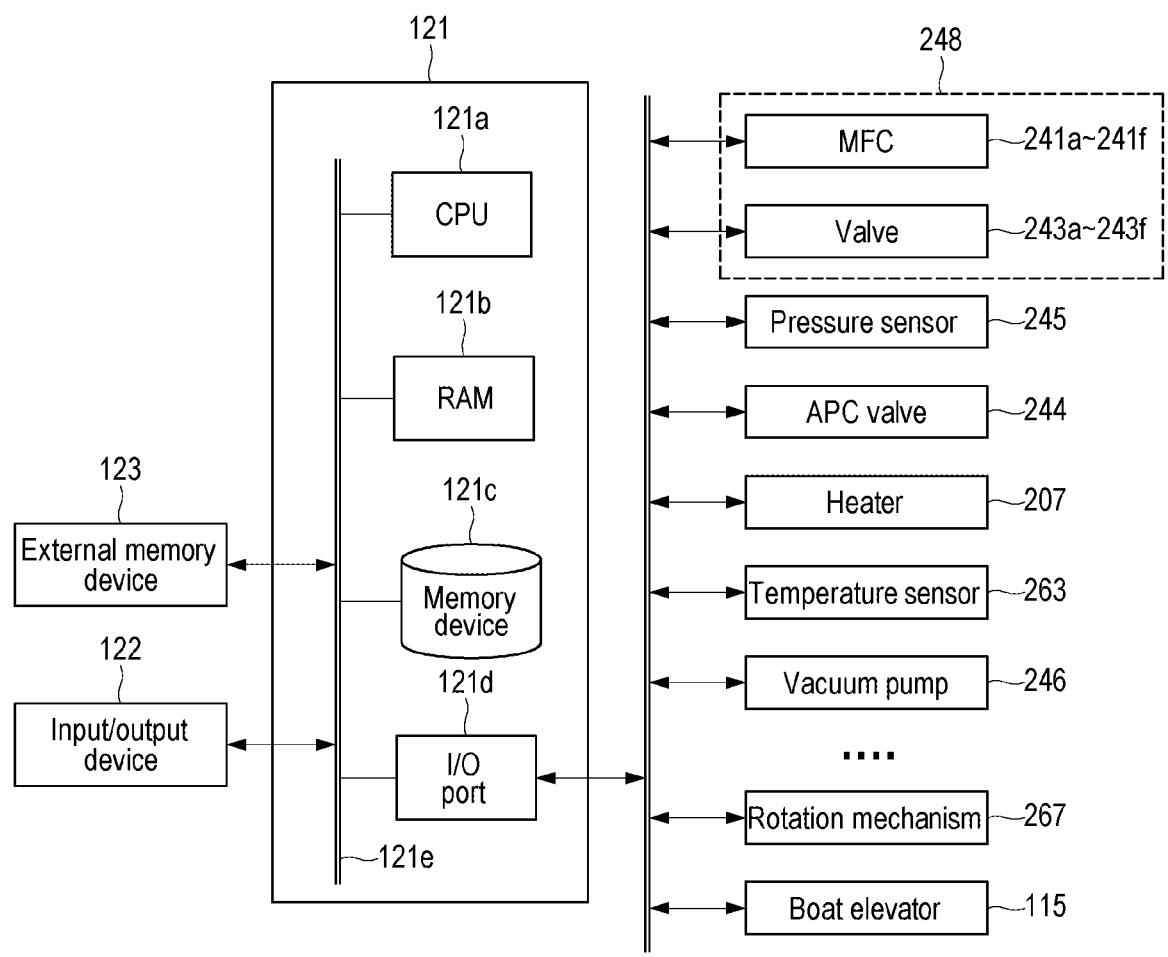
FIG. 3 is a schematic configuration diagram of a controller of the substrate processing apparatus used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 including, e.g., a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of substrate processing to be described later are written, are readably stored in the memory device 121c. The process recipe function as a program for causing the controller 121 to execute each sequence in a film forming process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the rotation mechanism 267, the boat elevator 115, and so on.

The CPU 121a is configured to read and execute the control program from the memory device 121c. The CPU 121a also reads the recipe from the memory device 121c according to an input of an operation command from the input/output device 122. The CPU 121a is configured to control the flow rate adjusting operation of various kinds of gases by the MFCs 241a to 241f, the opening/closing operation of the valves 243a to 243f, the opening closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down by the boat elevator 115, and so on, according to contents of the read recipe.

The controller 121 may be configured by installing, on a computer, the aforementioned program stored in an external memory device 123 (for example, a magnetic disk such as a hard disk, an optical disk such as a CD, a magneto-optical disk such as an MO, a semiconductor memory such as a USB memory, or the like). The memory device 121c and the external memory device 123 are configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121C and the external memory device 123. Alternatively, the program may be supplied to the computer using communication means such as the Internet or a dedicated line, instead of using the external memory device 123.

(2) Substrate Processing Process

A sequence example of forming a silicon oxide film (SiO film) on a wafer 200 as a substrate using the aforementioned substrate processing apparatus, which is one of the processes for manufacturing a semiconductor device, will be described below with reference to FIG. 4. In the following description, the operations of the respective parts constituting the substrate processing apparatus are controlled by the controller 121.

Figure 4:
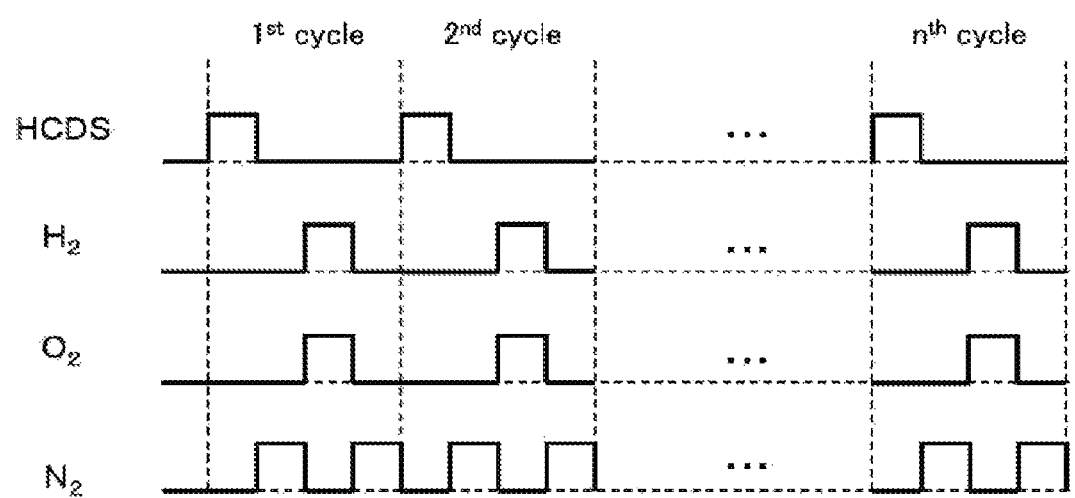
FIG. 4 is a diagram showing a film forming sequence according to an embodiment of the present disclosure.

In the film forming sequence shown in FIG. 4, a SiO film as a film containing Si and O is formed on a wafer 200 by performing a cycle a predetermined number of times (once or more), the cycle including non-simultaneously performing: a step 1 of supplying an HCDS gas as a precursor to a wafer 200 in the process chamber 201 via the nozzle 249a as a first nozzle and the nozzle 249b as a second nozzle disposed at a position separated from the nozzle 249a and exhausting an internal atmosphere of the process chamber 201 from a plurality of exhaust ports 204c and 204d arranged at a position not facing the gas ejection hole 250a of the nozzle 249a and the gas ejection hole 250b of the nozzle 249b in a plan view, and a step 2 of supplying an $O_2$ gas as a reactant to the wafer 200 in the process chamber 201 via the nozzle 249c as a third nozzle and exhausting the internal atmosphere of the process chamber 201 from the plurality of exhaust ports 204c and 204d.

The step 2 includes a period during which the $O_2$ gas as the reactant and an $H_2$ gas as a reactant are simultaneously supplied to the wafer 200. The $H_2$ gas is supplied from the nozzle 249a.

In this specification, the film forming sequence shown in FIG. 4 may be expressed as follows for the sake of convenience. The same notation is used for film forming sequences in modifications and other embodiments to be described later.

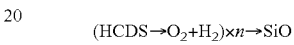

$(HCDS \rightarrow O_2 + H_2) \times n \rightarrow SiO$

When the term "wafer" is used in the present disclosure, it may refer to a wafer itself or a laminated body of a wafer and a predetermined layer or film formed on a surface of the wafer. When the phrase "a surface of a wafer" is used in the present disclosure, it may refer to a surface of the wafer itself or a surface of a predetermined layer or the like formed on the wafer. When the expression "a predetermined layer is formed on a wafer" is used in the present disclosure, it may mean that a predetermined layer is directly formed on a surface of a wafer itself or that a predetermined layer is formed on a layer or the like formed on a wafer. When the term "substrate" is used in the present disclosure, it may be synonymous with the term "wafer."

(Wafer Charging and Boat Loading)

The plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 through the O-ring 220b.

(Pressure Adjustment and Temperature Adjustment)

An interior of the process chamber 201, namely, a space in which the wafers 200 exist, is vacuum-exhausted (de-pressurization-exhausted) by the vacuum pump 246 so as to reach a desired pressure (degree of vacuum). In this operation, an internal pressure of the process chamber 201 is measured by the pressure sensor 245. The APC valve 244 is feedback-controlled based on the measured pressure information. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The exhaust of the interior of the process chamber 201 and the heating and rotation of the wafers 200 may be continuously performed at least until the processing of the wafers 200 is completed.

(Film forming Step)

Thereafter, the following steps 1 and 2 are sequentially executed.

[Step 1]

In this step, an HCDS gas is simultaneously supplied to the wafer 200 in the process chamber 201 from the nozzles 249a and 249b separated from each other.

Specifically, the valves 243a and 243b are opened to flow the HCDS gas into the gas supply pipes 232a and 232b. The flow rate of the HCDS gas is adjusted by the MFCs 241a and 241b and the HCDS gas is supplied into the process chamber 201 via the nozzles 249a and 249b. The HCDS gas supplied into the process chamber 201 from the gas ejection boles 250a and 250b of the nozzles 249a and 249b flows toward the center of the wafer 200 as indicated by a dash-dot line arrow in FIG. 2, collides with the wafer 200 in the vicinity of the center of the wafer 200 to be decelerated, and diffuses (disperses) in a plane of the wafer 200, and flows toward each of the exhaust ports 204c and 204d. At this time, the HCDS gas is supplied over the ill-plane entire region of the wafer 200. Thereafter, the HCDS gas flows into the exhaust space 205 via the exhaust ports 204c and 204d and is exhausted from the exhaust pipe 231. At this time, the valves 243d to 243f may be opened to flow an $N_2$ gas into the gas supply pipes 232d to 232f. In this case, the flow rate of the $N_2$ gas is adjusted by the MFCs 241d to 241f and the $N_2$ gas is supplied into the process chamber 201 via the nozzles 249a to 249c and is exhausted from the exhaust pipe 211 via the exhaust ports 204c and 204d and the exhaust space 205.

By supplying the HCDS gas to the wafer 200, a Si-containing layer (first layer) containing Cl is formed on the surface of the wafer 200. The Si-containing layer containing Cl is formed on the surface of the wafer 200 by physical adsorption of HCDS, chemisorption of substances m which a portion of HCDS is decomposed, thermal decomposition HCDS, or the like. That is, the Si-containing layer containing Cl may be an adsorption layer (physical adsorption layer or chemisorption layer) of substances in which HCDS or a portion of HCDS decomposed or may be a Si layer containing Cl. Hereinafter, the Si-containing layer containing Cl is also simply referred to as a Si-containing layer.

After forming the Si-containing layer on the wafer 200, the valves 241a and 243b are closed to stop the supply of the HCDS gas into the process chamber 201. Then, the interior of the process chamber 201 is vacuum-exhausted to exclude a gas or the like remaining in the process chamber 201 from the interior of the process chamber 201. At this time, the valves 243d to 241f are opened to supply an $N_2$ gas into the process chamber 201. The $N_2$ gas acts as a purge gas.

[Step 2]

After the step 1 is completed, an $O_2$ gas and $H_2$ gas are simultaneously supplied from the nozzles 249c and 249a arranged in close proximity to the wafer 200 in the process chamber 201.

Specifically, the valves 243c and 243a are petted to flow the $O_2$ gas and the $H_2$ gas into the gas supply pipes 232c and 232a respectively. The flow rates of the $O_2$ gas and the $H_2$ gas are adjusted by the MFCs 241c and 241a and the $O_2$ gas and the $H_2$ gas are supplied into the process chamber 201 via the nozzles 249c and 249a respectively. The $O_2$ arts and the $H_2$ gas respectively supplied into the process chamber 201 from the gas ejection holes 250c and 250a of the nozzles 249c and 249a flow t toward the center of the wafer 200, mixed to react will each other in the process chamber 201 during the process, diffuse into the surface of the wafer 200, and then exhausted from the exhaust pipe 231 via the exhaust ports 204c and 204d and the exhaust space 205. At this time, the $O_2$ gas and the $H_2$ gas a together simultaneously supplied to the wafer 200. The opening/closing control of the valves 243d to 243f is the same as the opening/closing control of the valves 243d to 243f in the step 1.

By together simultaneously supplying the $O_2$ gas and the $H_2$ gas into the process chamber 201, these gases are thermally activated (excited) in non-plasma to react with each other under a heated reduced pressure atmosphere, thereby gene oxidizing species containing oxygen such as atomic oxygen (O) but not containing water ($H_2O$). Then, mainly due to the oxidizing species, oxidation is performed on the Si-containing layer formed on the wafer 200 in the step 1. Since the energy of the oxidizing species is higher than a binding energy of an Si—Cl bond or the like contained in the Si-containing layer, by giving the energy of the oxidizing species to the Si-containing layer, the Si—Cl bonds and the like contained in the Si-containing layer are separated. Cl or the like separated from the bond with Si is removed from the layer and is discharged as ($Cl_2$, HCl and the like. In addition, when the bond with Cl or the like is cut off, dangling bonds of remaining Si are combined with O contained in the oxidizing species to form a Si—O bond. In this way, the Si-containing layer contains Si and O, and is changed (modified) into a layer containing few impurities such as Cl, that is, a highly pure SiO layer (second layer). According to this oxidation, an oxidizing power can be greatly improved over a case where an $O_2$ gas or an $H_2O$ gas (vapor) is supplied alone. That is, by adding the $H_2$ gas to the $O_2$ gas under a reduced pressure atmosphere, the oxidizing power can be significantly improved over a case when the $O_2$ gas or the $H_2O$ gas is supplied alone.

After changing the Si-containing layer into the SiO layer, the valves 243c and 243a are closed to stop the supply of the $O_2$ gas and the $H_2$ gas into the process chamber 201. Then, a gas and the like remaining in the process chamber 201 are excluded from the interior of the process chamber 201 according to the same processing procedure as in the step 1.

(Performing Predetermined Number of Times)

A cycle that non-simultaneously, i.e., without synchronization, performs the steps 1 and 2 is performed one or more times (n times) to thereby form a SiO film having a desired film thickness on the wafer 200. This cycle may be repeated multiple times in some embodiments. That is to say, the thickness of the SiO layer formed per one cycle may be set to be smaller than a desired film thickness. Thus, the above cycle may be repeated multiple times until the film thickness of a SiO film formed by laminating SiO layers becomes equal to the desired film thickness in some embodiments.

The process conditions of the step 1 are exemplified as follows.

HCDS gas supply flow rate (per gas supply pipe): 5 to 2,000 sccm or 50 to 1,000 sccm in some embodiments HCDS gas supply time: 1 to 120 seconds or 1 to 60 seconds in some embodiments $N_2$ gas supply flow rate (per gas supply pipe): 0 to 10,000 sccm Processing temperature: 250 to 800 degrees C. or 400 to 700 degrees C. in some embodiments.

Processing pressure: 1 to 2,666 Pa or 67 to 1,333 Pa in some embodiments

The process conditions of the step 2 are exemplified as follows.

$O_2$ gas supply flow rate: 100 to 10,000 sccm $H_2$ gas supply flow rate: 100 to 10,000 sccm $O_2$ gas and $H_2$ gas supply time: 1 to 120 seconds or 1 to 60 seconds in some embodiments Processing pressure: 13.3 to 1,333 Pa or 13.3 to 399 Pa in some embodiments Other processing conditions are the same as those as in the step 1

As the precursor gas, in addition to the HCDS gas, it may be possible to use, e.g., a chlorosilane precursor gas such as a monochlorosilane ($SiH_3Cl$, abbreviation: MCS) gas, a chlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas or the like.

As the first reaction gas, in addition to the $O_2$ gas, it may be possible to use, e.g., an O-containing gas such as a nitrous oxide ($N_2O$) gas, a nitrogen monoxide (NO) gas, a nitrogen dioxide ($NO_2$) gas, an ozone ($O_3$) gas, a $H_2O$ gas, a carbon monoxide (CO) gas, a carbon dioxide ($CO_2$) gas or the like.

As the second reaction gas, in addition to the $O_2$ gas, it may be possible to use, e.g., an O-containing gas such as a heavy hydrogen ($D_2$) gas or the like.

As the inert gas, in addition to the $N_2$ gas, it may be possible to use, e.g., a rare gas such as an Ar gas, a He gas, a Ne gas, a Xe gas, or the like.

(After-Purge Step and Atmospheric Pressure Returning Step)

After the film forming step is completed, a $N_2$ gas is supplied into the process chamber 201 from each of the gas supply pipes 232d to 232f and is exhausted through the exhaust pipe 231 via the exhaust ports 204c and 204d, and the exhaust space 205. The $N_2$ gas acts as a purge gas. Thus, the interior of the process chamber 201 is purged and a residual gas and reaction byproducts remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to an atmospheric pressure (return to atmospheric pressure).

(Boat Unload and Wafer Discharge)

The seal cap 219 is moved down by the boat elevator 115 to open the lower end of the manifold 209. The processed wafers 200 supported by the boat 217 are unloaded from the lower end of the manifold 209 and moved outside of the reaction tube 210 (boat unload). After the processed wafers 200 are unloaded out of the reaction tube 210, they are discharged from the boat 217 (wafer discharge).

(3) Effects According to the Present Embodiment

According to the present embodiment, one or more effects set forth below may achieved.

(a) By placing each of the plurality of exhaust ports 204c and 204d in a position not facing the gas ejection holes 250a and 250b, with the center of the wafer 200 accommodated in the process chamber 201 interposed therebetween, in a plan view, it is possible to enhance the controllability of the wafer in-plane film thickness distribution (hereinafter simply referred to as in-plane film thickness distribution) of the SiO film formed on the wafer 200.

Figure 8A:
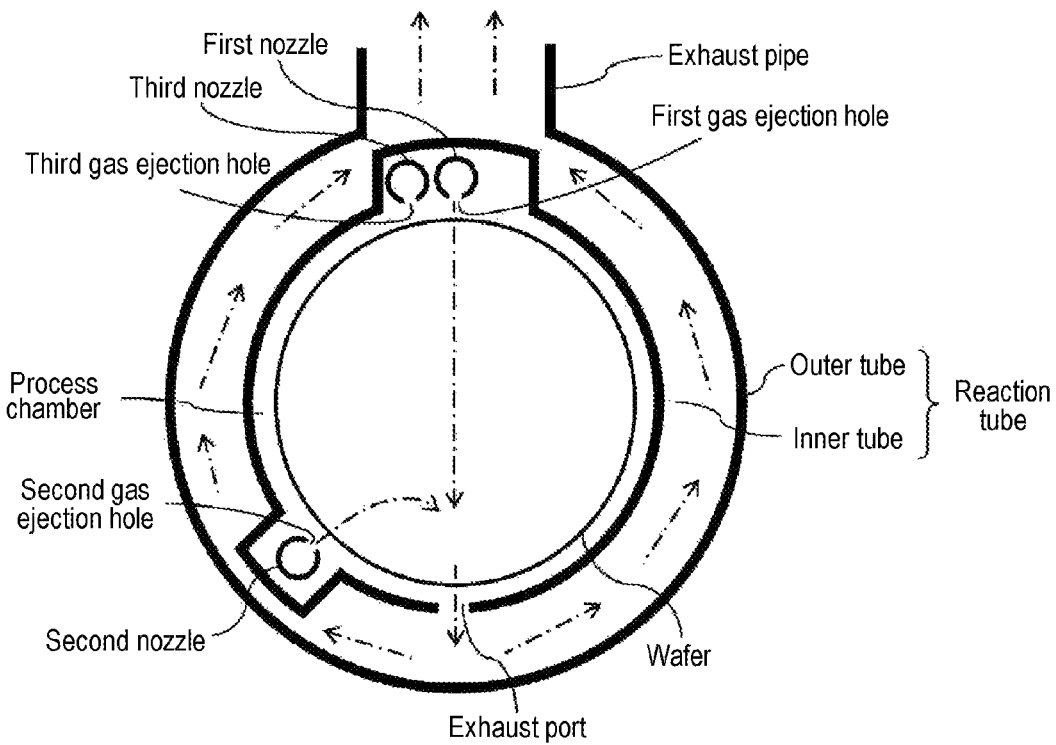
FIG. 8A is a view schematically showing a flow of gas in the process chamber when gas ejection holes and an exhaust port are opposite each other and FIG. 8B is a view schematically showing a flow of gas in the process chamber when the gas ejection holes and the exhaust port do not face each other.

This is because, as shown in FIG. 8A, one exhaust port is installed in the inner tube, and, when this exhaust port is disposed a position opposite the first gas ejection hole, with the center of the wafer accommodated in the process chamber interposed therebetween, in a plan view, the HCDS gas supplied into the process chamber from the first and second gas ejection holes flows as indicated by the dash-dot line arrow in the figure. That is, the HCDS gas supplied from the first gas ejection hole flow linearly via the center of the wafer toward the exhaust port with little deceleration and is discharged out of the process chamber via the exhaust port. In addition, the HCDS gas supplied from the second was ejection hole is changed in its direction toward the exhaust port without reaching the center of the wafer and is discharged out of the process chamber via the exhaust port. That is, when the exhaust port is disposed as shown in FIG. 8A, it is difficult for the HCDS gases simultaneously supplied from the first and second gas ejection holes to collide with each other in the vicinity of the center of the wafer to be decelerated and dispersed in the plane of the wafer. In this case, the in-plane film thickness distribution of the SiO film formed on the wafer may ha a distribution in which it is the thickest at a peripheral portion (outer peripheral portion) of the surface of the wafer and becomes gradually thinner as it approaches a central portion of the surface of the wafer (hereinafter referred to as a center-concave distribution), and an extent of the distribution may be stronger. Such a tendency can be equally applied even when a plurality of exhaust ports is installed in the inner tube and at least one of the plurality of exhaust ports is disposed at a position facing one of the first and second gas ejection holes.

Figure 8B:
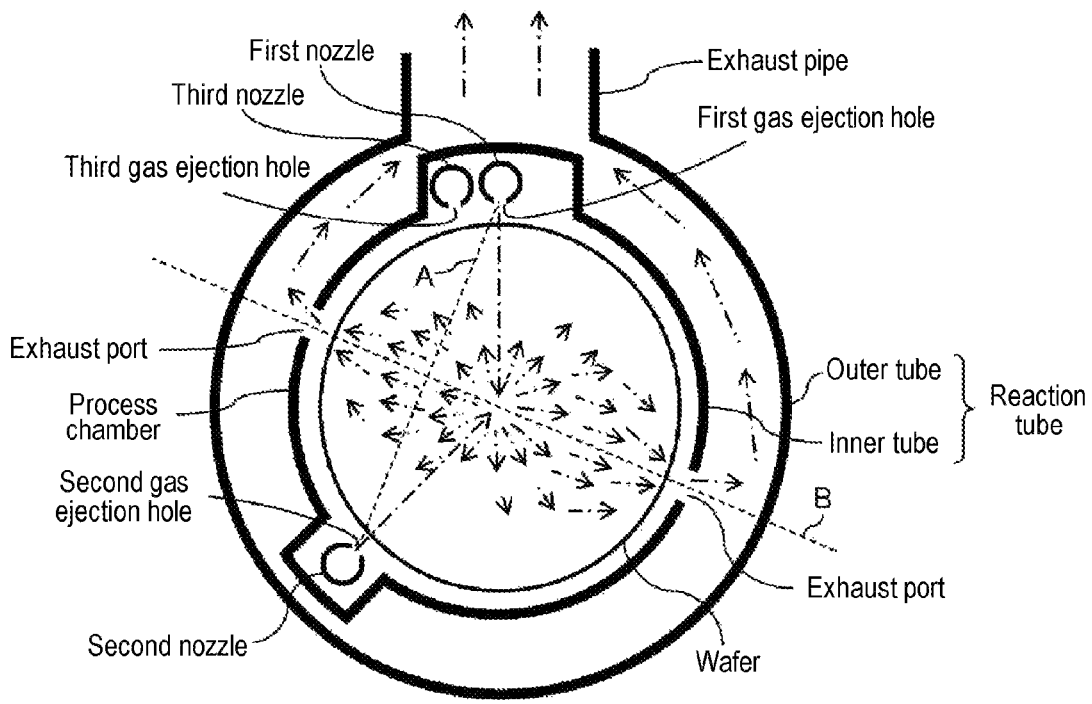

In contrast, as shown in FIG. 8B, when two exhaust ports are installed in the inner tube and each of these two exhaust ports is disposed so as not to face the first and second gas ejection holes, with the center of the wafer accommodated in the process chamber interposed therebetween, in plan view, the HCDS gases supplied into the process chamber via the first and second gas ejection holes flow as indicated by the dash-dot line arrow in the figure. That is, the HCDS gases supplied from the first and second gas ejection holes flow toward the center of the wafer, collide with each other and decelerate in the vicinity of the center of the wafer, are dispersed in the plane of the wafer, and flow toward each of the two exhaust ports. When the exhaust ports are arranged as shown in FIG. 8B, the degree of the center-concave distribution of the SiO film formed on the wafer can be relaxed. Then, the in-plane film thickness of the SiO film can have a flat film thickness distribution (hereinafter also referred to as a flat distribution) in which a change in film thickness is small from the central portion to the peripheral portion of the surface of the wafer 200 or further a distribution in which the film thickness is the thinnest at the peripheral portion of the surface of the wafer and gradually increase as it approaches the central portion thereof (hereinafter referred to as center-convex distribution). That is, the in-plane film thickness distribution of the SiO film formed on the wafer can be controlled over a wide range and the in-plane film thickness uniformity can also be improved.

(b) As in the present embodiment, when each of the plurality of exhaust ports 204c and 204d is disposed on the straight line B which is a perpendicular bisector of the line segment A connecting the gas ejection hole 250a and the gas ejection hole 250b in plan view, the controllability of the in-plane film thickness distribution of the SiO film formed on the wafer 200 can be further enhanced. This is because when the exhaust ports 204c and 204d are arranged in this way, it is not only possible for the HCDS gases simultaneously supplied from the gas injection holes 250a and 250b to collide with each other and decelerate in the vicinity of the center of the wafer, but also possible for the HCDS gas after the collision in the center of the wafer 200 to be diffused (dispersed) substantially in line symmetry with respect to the straight line Bas an axis. As a result, it is possible to further improve the in-plane film thickness uniformity of the SiO film formed on the wafer 200.

(c) The above-described effects can be obtained in the same manner when the aforementioned precursor gas other than the HCDS gas is used, the aforementioned O-containing gas other than the $O_2$ gas is used, the aforementioned H-containing gas other than $H_2$ the gas is used, or the inert gas other than the $N_2$ gas is used.

(4) Modifications

This embodiment can be modified as in the following modifications, which may be used in proper combination.

[First Modification]

Figure 6A:
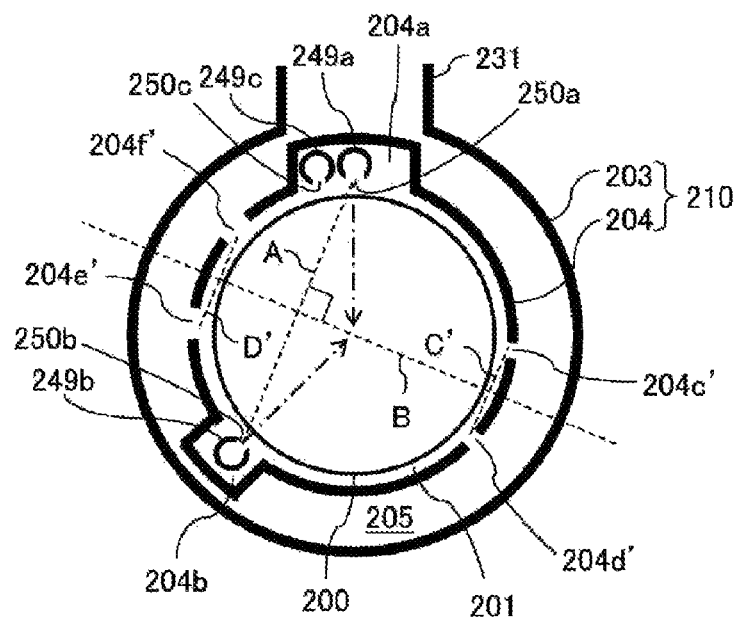
FIGS. 6A and 6B are schematic configuration views showing a modification of the vertical processing furnace of the substrate processing apparatus used in one embodiment of the present disclosure.

As shown in FIG. 6A, four exhaust ports 204c' to 204f' may be formed on the side wall of the inner tube 204. In this case, the four exhaust ports 204c' to 204f' are disposed in line symmetry with respect to the straight line which is a perpendicular bisector of the line segment A connecting the gas election holes 250a and 250b, in plan view. That is, a line segment C' connecting the exhaust ports 204c' and 204d' and the straight line B are made orthogonal to each other and the exhaust ports 204c' and 204d' are disposed in line symmetry with respect to the straight line B. Further the line segment D' connecting the exhaust ports 204e' and 204f' and the straight line B are made orthogonal to each other and the exhaust ports 204e' and 204f' are disposed in line symmetry with respect to the straight line B.

Figure 6B:
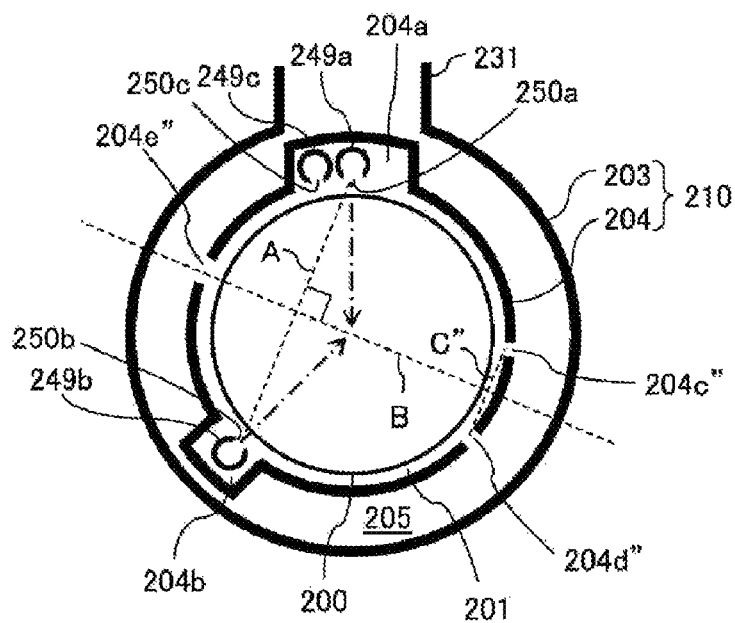

As shown in FIG. 6B, three exhaust ports 204c" to 204e" may be formed on the side wall of the inner tube 204. In this case, at least one the exhaust port 204e in this example) of the three exhaust ports 204c" to 204e" is disposed on the straight line B which is the perpendicular bisector of the line segment A connecting the gas ejection holes 250a and 250b, in plan view, and the others (in this example, the exhaust ports 204c" to 204d") except the at least one of the three exhaust ports 204c" to 204e" are disposed in line symmetry with respect to the straight line B. That is, the exhaust ports 204e" is disposed on the straight line B, the line segment C" connecting the exhaust ports 204c" and 204d" and the straight line B are made orthogonal to each other, and the exhaust ports 204c" and 204d" are disposed in line symmetry to the straight line B.

Even in this case, the same effects as in the case of using the substrate processing apparatus shown in FIGS. 1 and 2 can be obtained when the above-described film forming sequence shown in FIG. 4 is performed. In addition, by increasing the number of exhaust ports installed in the inner tube 204, the HCDS gases colliding with each other at the center of the wafer 200 can be diffused (dispersed) more uniformly in the plane of the wafer 200, thereby further improving the in-plane film thickness uniformity of the SiO film formed on the wafer 200.

(Second Modification)

Figure 5:
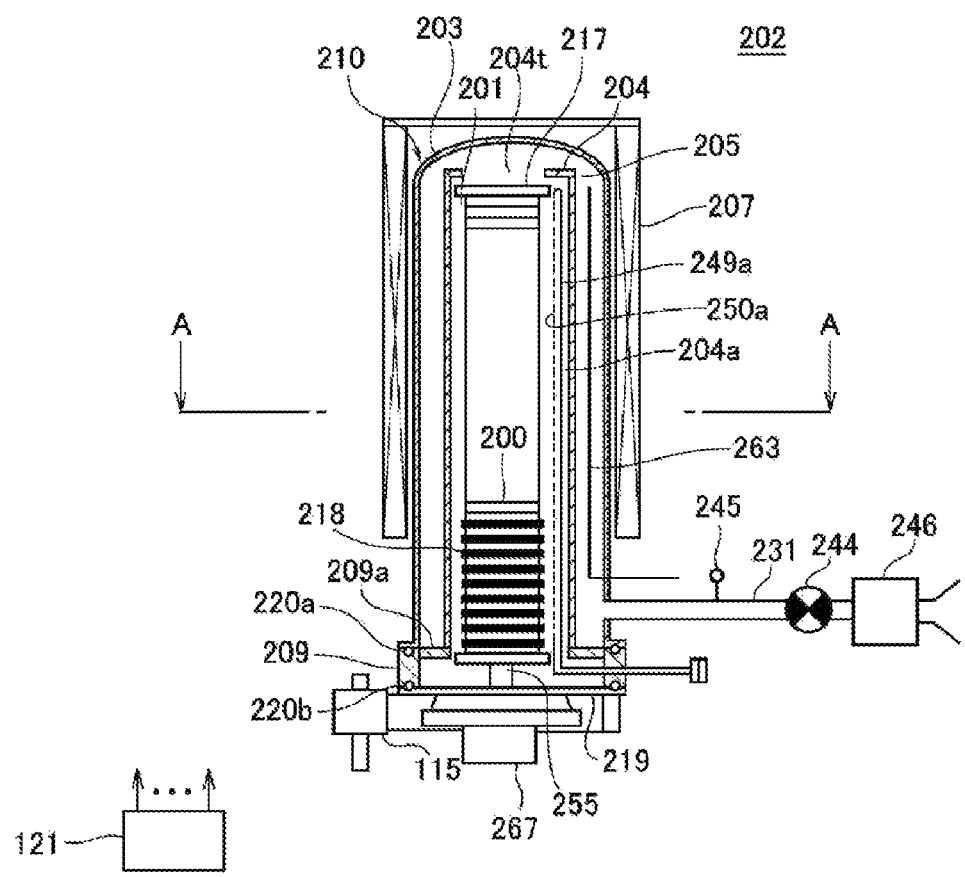
FIG. 5 is a sectional configuration view showing a modification of the vertical-processing furnace of the substrate processing apparatus used in one embodiment of the present disclosure.

As shown in FIG. 5, as an exhaust port different from the exhaust ports 204c and 204d, an opening 204t may be formed on the ceiling surface of the inner tube 204.

Even in this case, the same effects as when using the substrate processing apparatus shown in FIGS. 1 and 2 can be obtained when carrying out the above-described forming sequence shown in FIG. 4. In addition, by forming the opening 204t in the upper portion of the inner tube 204, it is possible to increase a gas replacement efficiency in the upper portion of the process chamber 201 or suppress a pressure rise in the upper portion of the process chamber 201 when the steps 1 and 2 are performed. As a result, it is possible to optimize the concentration distribution (distribution in the wafer loading direction) of various gases in the process chamber 201, thereby making it possible to improve the inter-wafer film thickness uniformity.

By appropriately adjusting the gap (clearance) between the upper portion of the inner tube 204 and the ceiling plate at the upper end of the boat 217 or appropriately adjusting the diameter of the opening 204t, it is possible to finely adjust the inter-wafer film thickness distribution.

(Third Modification)

It has been illustrated in the embodiment described with reference to FIGS. 1 to 4 and 7A that the configurations (arrangement, pitch and the number of holes) of the gas ejection holes 250a and 250b of the nozzles 249a and 249b are the same. However, the present disclosure is not limited to such an embodiment. That is, the configurations (arrangement, pitch and the number of holes) of the gas ejection holes 250a and 250b of the nozzles 249a and 249b may be different from each other.

Figure 7B:
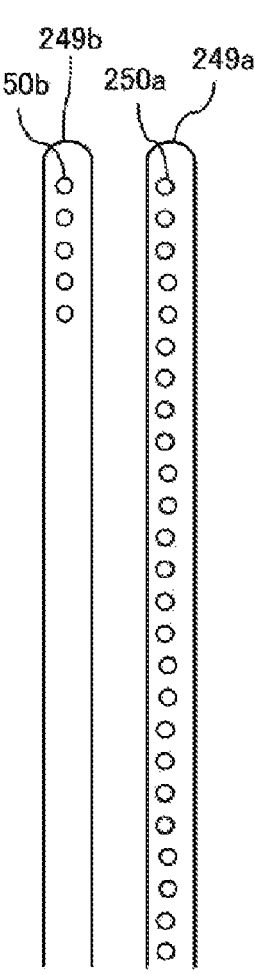
Figure 7C:
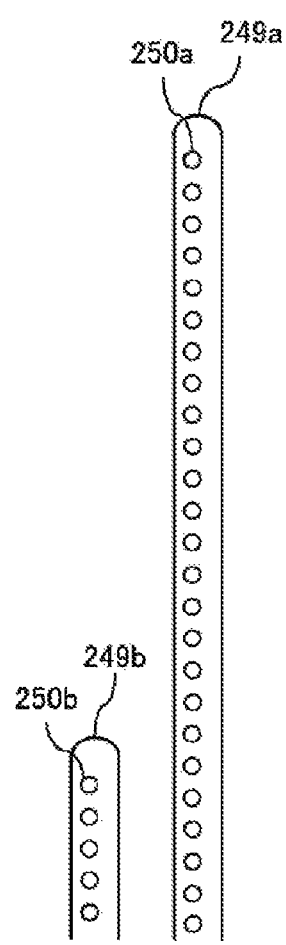
Figure 7D:
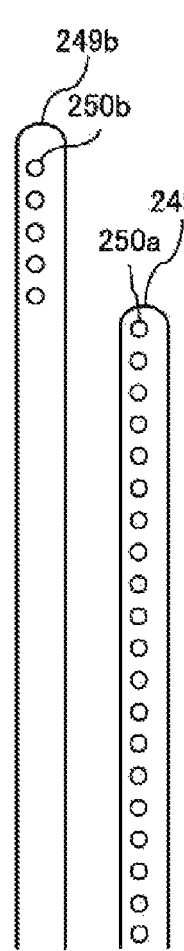
Figure 7E:
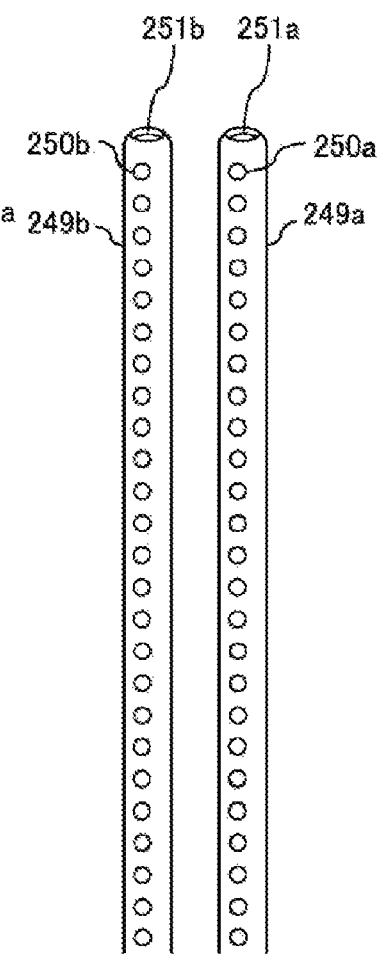

For example, as shown in FIG. 7B, gas ejection holes 250a may be formed over the entire re oar from the lower portion to the upper portion of the nozzle 249a. The gas ejection holes 250b may be formed only in the upper portion of the nozzle 249b. The gas ejection holes 250b may not be formed in other portions. Further, for example, as shown in FIG. 7C, the gas ejection holes 250a may be formed over the entire region from the lower portion to the upper portion of the nozzle 249a. The gas ejection holes 250b may be formed only in the lower portion of the nozzle 249b. The gas ejection holes 250b may not be formed in other portions (the entire length may be shortened and the gas ejection holes 250b may be formed over the entire region of the side surface thereof). Further, for example, as shown in FIG. 7D, the gas ejection holes 250 may not be formed in the upper portion of the nozzle 249a (the entire length is also shortened). The gas ejection holes 250a may be formed in the entire region other than the upper portion. The gas ejection holes 250b may be formed only in the upper portion of the nozzle 249b. The gas ejection hole 250b may not be formed in the other portions. Further, for example, as shown in FIG. 7E, the gas ejection holes 250a and 250b may be formed over the entire region front the lower portion to the upper portion of the nozzles 249a and 249b, respectively. The gas ejection holes (ceiling holes) 251a and 251b opened in the vertical direction may be formed at the ceiling portion of the nozzles 249a and 249b, respectively. In this case, an opening area (diameter) of the gas ejection hole 251a may be larger than an opening area (diameter) of the gas ejection hole 250a in some embodiments, and an opening area (diameter) of the gas ejection hole 251b may be larger than an opening area (diameter) of the gas ejection hole 250b in some embodiments. For example, the diameter of the gas ejection hole 251a may be not less than two times and not more than 8 times the diameter of the gas ejection bole 250a in some embodiments, and the diameter of the gas ejection hole 251b may be not less than two times and not more than 8 times the diameter of the gas ejection hole 250b in some embodiments. In addition, a ceiling hole may not be formed n the ceiling portion of one of the nozzles 249a and 249b.

Even in this case, the same effects as in the case of using the substrate processing apparatus shown in FIGS. 1 and 2 can be obtained when the above-described film forming sequence shown in FIG. 4 is performed. Further, when the step 1 is performed, it is possible to finely adjust and optimize a concentration distribution (distribution in the wafer loading direction) of the HCDS gas in the process chamber 201, thereby improving uniformity of the inter-wafer film thickness.

Figure 9A:
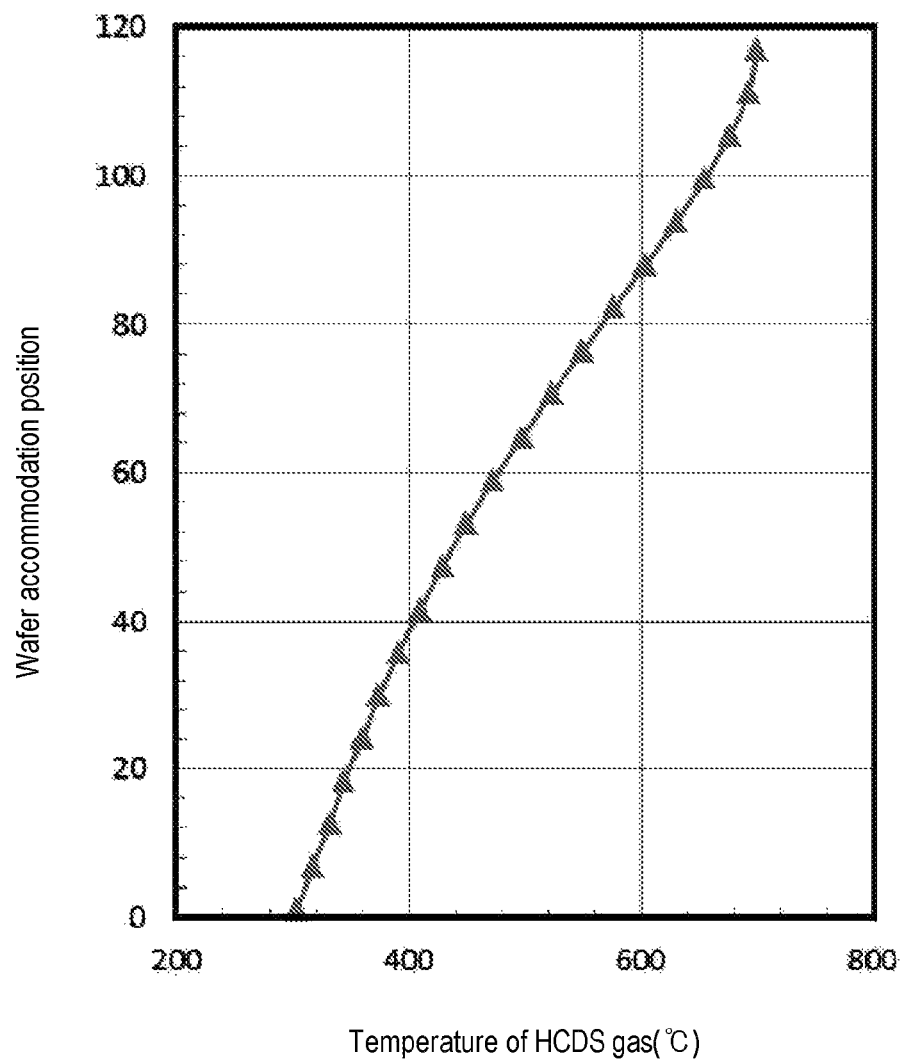

This is because the HCDS gas supplied into the process chamber is thermally decomposed into $A \times Si + B \times SiCl_2 + C \times SiCl_4$ by heating (where, A, B and C are arbitrary numbers and indicate a ratio to the total amount of decomposition products). Among the decomposition products, the component mainly contributing to the formation of the SiO film is $SiCl_2$. According to an intensive study by the inventors, it has been found that an amount of $SiCl_2$ generated by thermal decomposition tends to be relatively large and a formation rate of the SiO film tends to increase in the central portion of the wafer arrangement region. On the other hand, it has also been found that an amount of $SiCl_2$ generated by thermal decomposition tends to be relatively small and a formation rate of the SiO film tends to decrease in the upper and lower portions of the wafer arrangement region. FIG. 9A is a view showing the temperature of the HCDS gas supplied into the processing chamber. In FIG. 9A, the horizontal axis represents a temperature [degrees C.] of the HCDS gas, and the vertical axis represents a wafer accommodation position (120 is the top and 0 is the bottom). It can be seen from FIG. 9A that the temperature of the HCDS gas supplied into the process chamber is about 300 degrees C. in the lower portion of the wafer arrangement region, whereas it is about 700 degrees C. in the upper portion. FIG. 9B is a view showing thermal decomposition characteristics of the HCDS gas. In FIG. 9B, the horizontal axis represents the temperature [degrees C.] of the HCDS gas and the vertical axis represents the amount [a. u.] of $SiCl_2$ generated by thermal decomposition of HCDS. It can be seen from FIG. 9B that the amount of $SiCl_2$ produced is small in a range where the temperature of the HCDS gas is less than 350 degrees C., becomes maximum in a range of 400 to 500 degrees C., and increases again when it reaches, for example, about 600 degrees C. beyond the range. When the temperature of the HCDS gas reaches 800 degrees C., thermal decomposition reaction of $2Si_2Cl_6 \rightarrow Si+3SiCl_3$ proceeds to generate almost no $SiCl_2$. It can be seen from these results that the generation amount of $SiCl_2$ contributing to the formation of the SiO film increases in the central portion of the wafer arrangement region and the generation amount of $SiCl_2$ contributing to the formation of the SiO film decreases in the upper and lower portions of the wafer arrangement region. In this case, the inter-wafer film thickness distribution of the SiO film formed on the wafer may be a distribution (arcuate distribution) in which it is the thickest at the central portion of the wafer arrangement region and becomes thinner at the lower or upper portion of the wafer arrangement region To avoid such a problem, it is very effective to use the nozzles 249a and 249b shown in any one of FIGS. 7B to 7E. By using the nozzles 249a and 249b shown in any one of FIGS. 7B to 7E, it is possible to supply (supplement) the HCDS gas to the upper or lower portion of the wafer arrangement region to promote generation of $SiCl_2$ contributing to the formation of the SiO film. This makes it possible to improve a wafer-to-wafer film thickness uniformity of the SiO film formed on the water 200 and to alleviate a degree of the above-described arcuate distribution.

Other Embodiments of the Present Disclosure

While some embodiments of the present disclosure have been specifically described above, the present disclosure is not limited to the aforementioned embodiments but may be differently modified without departing from the subject matter of the present disclosure.

For example, in the above-described embodiment, the example in which the nozzle accommodating chambers 204a and 204b have different sizes, shapes and volumes has been described, but the chambers may have the same size, shape and volume. By making the sizes, shapes and volumes of the nozzle accommodating chambers 204a and 204b equal to each other, it is possible to equalize the supply environments and supply conditions of the HCDS gas supplied from the nozzles 249a and 249b, thereby further improving the in-plane film thickness uniformity of the SiO film.

Further, for example, as a reactant, a nitrogen (N)-containing gas such as an ammonia ($NH_3$) gas, a carbon (C)-containing gas such as a propylene ($C_3H_6$) gas, an N- and C-containing gas such as a triethylamine (($C_2H_5)_3N$, abbreviation: TEA) gas, a boron (B)-containing gas such as a trichloroborane ($BCl_3$) gas may be used to form a silicon oxynitride film (SiON film), a silicon nitride film (SiN film), a silicon carbonitride film (SiCN film), a silicon oxycarbonitride film (SiOCN film), a silicon boroncarbonitride film (SiBCN film), a silicon boronitride film (SiBN film) or the like on a substrate according to the following film forming sequences. Even in these cases, the same effects as those of the above embodiment can be obtained. Processing procedures and processing conditions for supplying these reactants may be the same as those in the case of supplying the reactants in the above embodiment.

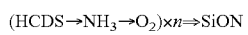(HCDS→$NH_3$→$O_2$)×n⇒SiON

(HCDS→NH3)×n⇒SiN

(HCDS→TEA)×n⇒SiCN

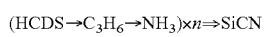(HCDS→$C_3H_6$→$NH_3$)×n⇒SiCN

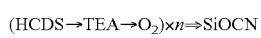(HCDS→TEA→$O_2$)×n⇒SiOCN

(HCDS→$C_3H_6$→$NH_3$→$O_2$)×n⇒SiOCN

(HCDS→$C_3H_6$→$BCl_3$→$NH_3$)×n⇒SiBCN

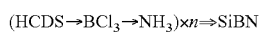(HCDS→$BCl_3$→$NH_3$)×n⇒SiBN

Further, for example as a precursor, a titaniumtetrachloride ($TiCl_4$) gas, a trimethylaluminum ($Al(CH_3)_3$, abbreviation: TMA) gas or the like may be used to form a titanium nitride film (TiN film), a titanium oxynitride film (TiON film), a titanium aluminum carbonitride (TiAlCN film), a titanium aluminum carbide film (TiAlC film), a titanium carbonitride film (TiCN film), a titanium oxide film (TiO film) or the like on the substrate according to the following film forming sequences. Even in these cases, the same effects as those of the above embodiment can be obtained. Processing procedures and processing conditions for supplying these precursors and reactants may be the same as those in the case of supplying the precursors and reactants in the above embodiment.

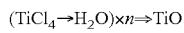($TiCl_4$→$H_2O$)×n⇒TiO

($TiCl_4$→$NH_3$)×n⇒TiN

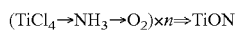($TiCl_4$→$NH_3$→$O_2$)×n⇒TiON

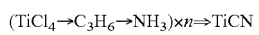($TiCl_4$→$C_3H_6$→$NH_3$)×n⇒TiCN

($TiCl_4$→TMA)×n⇒TiAlC

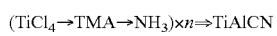($TiCl_4$→TMA→$NH_3$)×n⇒TiAlCN

Recipes used in substrate processing may be prepared individually according to the processing contents and may be stored in the memory device 121c via a telecommunication line or the external memory device 123 in some embodiments. Moreover, when the substrate processing starts, the CPU 121a may properly select an appropriate recipe from the recipes stored in the memory device 121c according to the processing contents in some embodiments. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

The example in which films are formed using a batch-type substrate processing apparatus capable of processing a plurality of substrates at a time has been described in the above embodiments. The present disclosure is not limited to the above embodiments but may be appropriately applied to, e.g., a case where films are formed using a single-wafer-type substrate processing apparatus capable of processing a single substrate or several substrates at a time. In addition, the example in which films are fumed using a substrate processing apparatus provided with a hot-wall-type processing furnace has been described in the above embodiments. The present disclosure is not limited to the above embodiments but may be appropriately applied to a case where films are formed using a substrate processing apparatus provided with a cold-wall-type processing furnace. Even in the case of using these substrate processing apparatuses, film formation can be performed under the same sequence and processing conditions as in the above-described embodiments and modifications and the same effects as those of the above embodiments and modifications can be obtained.

In addition, the various embodiments described above can be used in appropriate combination. In this case, the processing procedures and processing conditions may be the same as the processing procedures and processing conditions of the above-described embodiment.

According to the present disclosure in some embodiments, it is possible to control an in-plane film thickness distribution of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosure& The accompanying claims and their equivalents are intended to cover such forms or modifications as would fall within the scope and spirit of the disclosures.

What is claimed is:

1. A substrate processing apparatus comprising:
    a process chamber in which a process of forming a film containing a main element on a substrate is performed;
    a first nozzle configured to supply a precursor containing the main element to the substrate in the process chamber;
    a second nozzle separated from the first nozzle and configured to supply the precursor to the substrate in the process chamber;
    a third nozzle configured to supply a reactant to the substrate in the process chamber; and
    a plurality of first exhaust ports configured to exhaust an internal atmosphere of the process chamber,
    a precursor supply system configured to supply the precursor;
    a reactant supply system configured to supply the reactant;
    an exhaust system configured to exhaust the internal atmosphere of the process chamber from the plurality of first exhaust ports; and
    a controller configured to control the precursor supply system, the reactant supply system, and the exhaust system so as to perform the process of forming the film containing the main element on the substrate by performing a cycle a predetermined number of times, the cycle including non-simultaneously performing:
        a first process of supplying the precursor to the substrate in the process chamber via the first nozzle and the second nozzle and exhausting the internal atmosphere of the process chamber from the plurality of first exhaust ports; and
        a second process of supplying the reactant to the substrate in the process chamber via the third nozzle and exhausting the internal atmosphere of process chamber from the plurality of first exhaust ports,
    wherein each of the plurality of first exhaust ports is disposed at a position which does not face a first gas ejection hole of the first nozzle and a second gas ejection hole of the second nozzle, in a plan view.

2. The substrate processing apparatus of claim 1, wherein each of the plurality of first exhaust ports is disposed in line symmetry with respect to a perpendicular bisector of a straight line segment connecting the first gas ejection hole and the second gas ejection hole, in the plan view.

3. The substrate processing apparatus of claim 1, wherein at least one of the plurality of first exhaust ports is disposed on a perpendicular bisector of a straight line segment connecting the first gas ejection hole and the second gas ejection hole, and the others except the at least one of the plurality of first exhaust ports are disposed in line symmetry with respect to the perpendicular bisector, in the plan view.

4. The substrate processing apparatus of claim 1, further comprising:
    an outer reaction tube; and
    an inner reaction tube which is installed in the outer reaction tube to form the process chamber,
    wherein the plurality of first exhaust ports is disposed on a side surface of the inner reaction tube.

5. The substrate processing apparatus of claim 4, wherein a second exhaust port different from the plurality of first exhaust ports is installed on a ceiling surface of the inner reaction tube.

6. The substrate processing apparatus of claim 1, wherein a configuration of the first gas ejection hole of the first nozzle is the same as a configuration of the second gas ejection hole of the second nozzle.

7. The substrate processing apparatus of claim 1, wherein a configuration of the first gas ejection hole of the first nozzle is different from a configuration of the second gas ejection hole of the second nozzle.

8. The substrate processing apparatus of claim 7, wherein the first gas ejection hole is formed only on a first upper portion or a first lower portion of the first nozzle and is not formed in portions other than the first upper portion or the first lower portion of the first nozzle, or the second gas ejection hole is formed only on a second upper portion or a second lower portion of the second nozzle and is not formed in portions other than the second upper portion or the second lower portion of the second nozzle.

9. The substrate processing apparatus of claim 1, wherein the controller is configured to control the precursor supply system so that the act of supplying the precursor via the first nozzle and the act of supplying the precursor via the second nozzle are performed simultaneously in the first process.

10. The substrate processing apparatus of claim 1, wherein the controller is configured to control the precursor supply system and the exhaust system so that the precursor supplied via the first nozzle and the precursor supplied via the second nozzle collide with each other in a central portion of the substrate in the first process.

11. The substrate processing apparatus of claim 1, wherein each of the first nozzle, the second nozzle and the third nozzle is disposed on a side of the substrate.

12. The substrate processing apparatus of claim 4, wherein each of the first nozzle, the second nozzle and the third nozzle is provided in a nozzle accommodating chamber provided at a side wall of the inner reaction tube.

13. The substrate processing apparatus of claim 12, wherein the nozzle accommodating chamber protrudes outward from the side wall of the inner reaction tube.

14. The substrate processing apparatus of claim 12, wherein the nozzle accommodating chamber is formed in a channel shape and extends vertically.

* * * * *